United States Patent
Gustafson et al.

(10) Patent No.: US 7,298,282 B2
(45) Date of Patent: Nov. 20, 2007

(54) HEALTH MONITORING METHOD AND SYSTEM FOR A PERMANENT MAGNET DEVICE

(75) Inventors: James R. Gustafson, Granby, MA (US); Mahesh J. Shah, Lindenhurst, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 220 days.

(21) Appl. No.: 10/831,873

(22) Filed: Apr. 26, 2004

(65) Prior Publication Data

US 2005/0237212 A1    Oct. 27, 2005

(51) Int. Cl.
G08B 21/00    (2006.01)

(52) U.S. Cl. .............. 340/648; 340/679; 318/434; 318/565; 361/23

(58) Field of Classification Search ........... 340/648, 340/679; 310/68 B, 68 C; 318/565, 490, 318/138, 254, 439, 434; 388/909; 361/23–34
See application file for complete search history.

(56) References Cited

U.S. PATENT DOCUMENTS

| | | | | |
|---|---|---|---|---|
| 4,893,067 A | * | 1/1990 | Bhagwat et al. | 388/823 |
| 5,349,276 A | * | 9/1994 | Mezzatesta et al. | 318/268 |
| 5,629,870 A | * | 5/1997 | Farag et al. | 700/286 |
| 5,751,132 A | * | 5/1998 | Horvath et al. | 318/798 |
| 5,917,428 A | * | 6/1999 | Discenzo et al. | 340/870.01 |
| 5,938,529 A | * | 8/1999 | Rodesch et al. | 463/20 |
| 6,199,023 B1 | | 3/2001 | Kliman | |
| 7,091,724 B2 | * | 8/2006 | Heinzmann et al. | 324/546 |
| 2002/0097066 A1 | | 7/2002 | Pan et al. | |
| 2002/0125895 A1 | | 9/2002 | Awaji | |
| 2002/0175674 A1 | | 11/2002 | Raftari et al. | |
| 2005/0151658 A1 | * | 7/2005 | Kono et al. | 340/647 |

OTHER PUBLICATIONS

Search Report EP 05 25 2596.

* cited by examiner

*Primary Examiner*—Benjamin C. Lee
*Assistant Examiner*—Travis R. Hunnings
(74) *Attorney, Agent, or Firm*—Carlson, Gaskey & Olds

(57) ABSTRACT

A method and system for monitoring the performance of a permanent magnet device, such as a motor or generator, and providing early detection of motor performance deterioration. The back electromotive force (EMF) of the motor is measured at selected conditions when the motor is in a normal healthy condition to obtain a reference signature response. A measured signature is then obtained periodically during the life of the motor at the same conditions as the reference signature to check the current back EMF characteristic of the motor. If the measured signature deviates from the reference signature by a predetermined threshold, it indicates that the motor performance has degraded to a condition requiring attention.

16 Claims, 3 Drawing Sheets

HEALTH MONITORING METHOD AND SYSTEM FOR A PERMANENT MAGNET DEVICE

TECHNICAL FIELD

The present invention is directed to monitoring operation of an electrical device, and more particularly to a method and system that checks the health of a permanent magnet device, such as a motor or generator.

BACKGROUND OF THE INVENTION

Large-scale power generators often use gas turbine engines to supply power to a geographic region. Reliable start up of these engines is critical to ensure that power outages do not occur.

Electric starters are known for starting small engines, but the special requirements of large engines have generally made them inappropriate for use with large engines. Many gas turbines in the 20 to 50 MW range are derivatives of aircraft engines (known as "aeroderivatives" and, as such, they initially retained the lightweight, high-performance pneumatic starters from the initial design. As applications evolved, the pneumatic starters were replaced with hydraulic starters because weight is less of a concern in ground-based gas turbine engines. The next logical step is to apply electric motors to replace the hydraulic starter units.

One of the challenges in designing electric starters is to create a high-performance unit with minimal (packaging) size and total weight. Out of the currently available electric starter technology (i.e., induction, switched reluctance, permanent magnet), permanent magnet motors offer the highest performance density.

More particularly, electric starters rely on electric motors to convert electrical input power into mechanical power in the form of torque and rotation, which in turn is used to start an engine. All electric motors are prone to common failure modes, such as broken or shorted wires. However, despite their high performance density, permanent magnet motors are also prone to performance degradation resulting from demagnetization of the magnets due to, for example, excessive environmental temperatures. In any case, the power delivered by the permanent magnet motor may drop to zero or to a very low level, depending on the severity of the damage. Depending on the degree of failure, many of these degradations are not detectable and may result in operational failures or, in extreme cases, generation of excessive heat that may ignite or melt the starter components.

There is a desire for a system and method that can detect performance degradation in a permanent magnet-based electric starter.

SUMMARY OF THE INVENTION

The present invention is directed to a method and system for monitoring the performance of a permanent magnet motor and providing early detection of motor performance deterioration. In one embodiment, the back electromotive force (EMF) of the motor is measured at selected conditions, such as speed and temperature, to obtain a reference signature response. A measured signature is then obtained periodically during the life of the motor at the same conditions as the reference signature to check the current back EMF characteristic of the motor. If the measured signature deviates from the reference signature by a predetermined threshold, it indicates that the motor performance has degraded to a condition requiring attention.

By providing periodic monitoring of motor performance, the invention detects differences in the implied output torque capability of the motor before it reaches an unacceptable level. Thus, it is possible to notify users of a pending motor fault before an actual fault occurs, allowing the user to response pro-actively without waiting for the motor to actually fail before addressing motor problems. As a result, the invention makes it possible to use high-torque permanent magnet motors in applications, such as electric starting, where reliability is one of the critical parameters.

DETAILED DESCRIPTION OF THE EMBODIMENTS

Generally, the invention makes electric devices, and magnetic motors or generators in particular, more suitable for critical applications by incorporating a monitoring system that checks the health of the motor based on its output characteristics.

Figure 1:
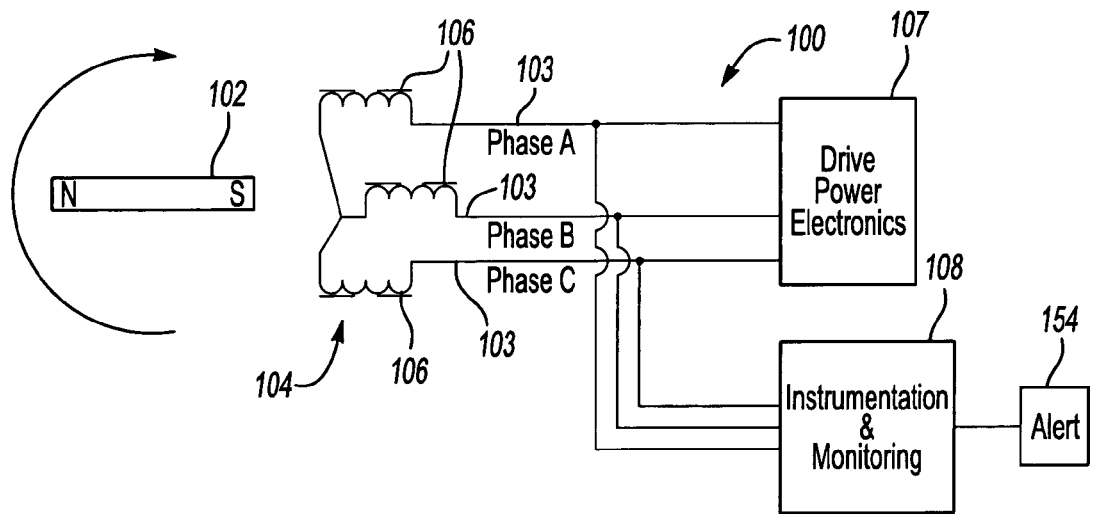
FIG. 1 is a schematic diagram of a permanent magnet motor to be monitored by the invention.
Figure 2:
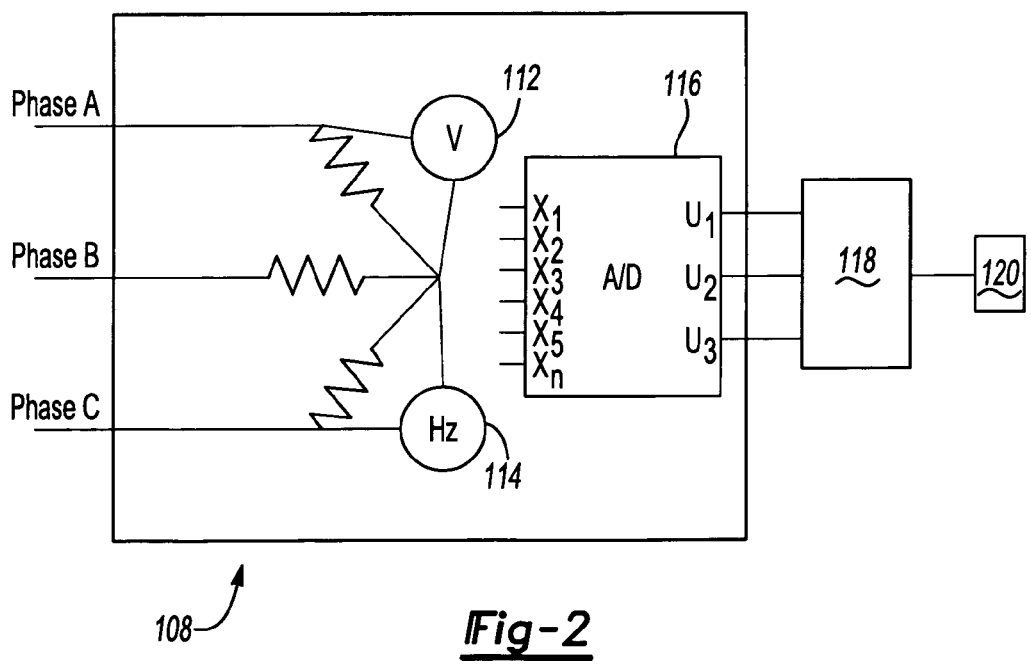
FIG. 2 is a schematic diagram of the monitoring system according to one embodiment of the invention.

FIG. 1 is a schematic diagram of a magnetic motor 100 whose operation can be monitored according to the invention. Note that FIGS. 1 and 2 are simplified for illustrative purposes and show only one pole of a multiple-pole device. The motor 100 includes a magnetic rotor 102, which is a permanent magnet, that rotates within a stator 104 having three phases A, B and C with corresponding coil windings 106. As is known in the art, drive power electronics 107 control the current moving through the windings 106 to control the magnetic field surrounding the windings 106, causing the magnetic rotor 102 to rotate as it repels and attracts the poles in the generated magnetic field.

FIG. 2 illustrates a wye-connected motor. As shown in FIG. 2, a monitoring module 108 monitors the voltage at each phase and uses this information to determine the overall health of the motor 100. As the magnetic rotor 102 rotates, it creates an alternating magnetic field that links the coils in the stator to induce a back EMF across each phase A, B and C. The typical measurements of the back EMF in this type of motor connection are made between two phase leads 103 (e.g., A-C, B-C, and A-B). The specific characteristics of the back EMF will vary depending on the overall health of the magnetic rotor 102, the windings 106, and any insulation (not shown) failure in the motor 100 as well as environmental conditions and motor speed. The back EMF across phase pairs can be measured by a voltmeter 112, which can measure either the RMS voltage or the peak-to-peak voltage. The monitoring module 108 also includes an optional speed sensor 114 to measure the frequency of the motor, if desired. Alternatively, the speed can be determined by the frequency and period of the back EMF trace itself, eliminating the need for a separate speed sensor. With the back EMF and motor speed information, it is possible to obtain a given back EMF response "signature" at a given condition (e.g., motor speed and temperature).

The signature generated by the motor 100 will vary depending on the health of the motor components. For example, if the magnetic rotor 102 has been demagnetized due to, for example, environmental conditions, the resulting back EMF signature will have a lower magnitude than the back EMF of a magnet in a healthy condition. Other motor component deterioration, such as wire shorts or breakages, will also cause the signature to deviate by, for example, exhibiting a voltage imbalance between two leads.

An analog-to-digital (A/D) converter 116 converts the analog voltage and frequency data from the voltmeter 112 and speed sensor 114 to digital data. The converted data is sent to a controller 118, which compares the converted data with data stored in a memory 120 to determine the health of the motor 100. The controller 118 can be any appropriate control device, such as a microprocessor-based device.

Figure 3:
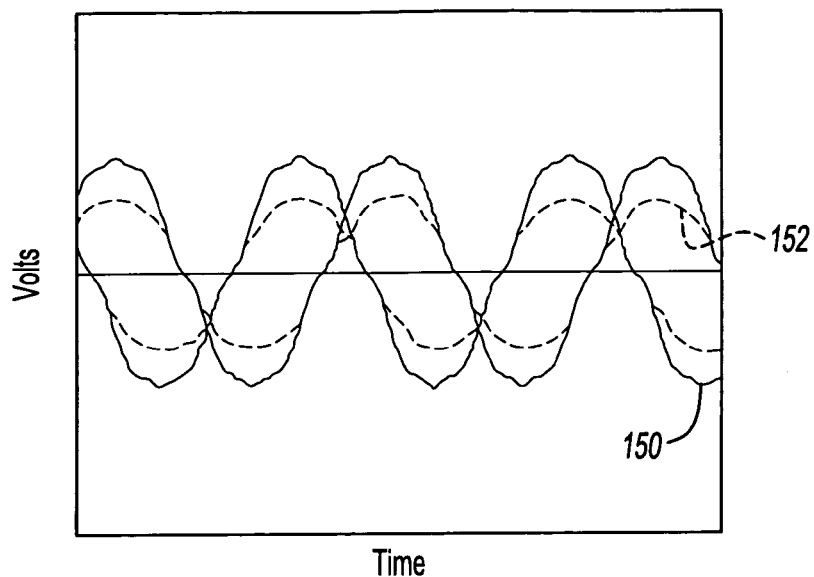
FIG. 3 is a graphic showing an example of a comparison conducted by the monitoring system of FIG. 2.

FIG. 3 illustrates an example of how the data is analyzed. A reference signature 150 of the motor 100 obtained at a given speed and temperature when the motor is in a normal healthy condition is stored in the memory 120. The motor 100 may then be periodically induced to spin freely, ideally at the same speed and temperature as when the reference signature 150 was obtained. The resulting measured signature 152 is then compared with the reference signature 150 to determine whether the measured signature 152 deviates from the reference by a predetermined threshold. If the measured signature 152 indicates that the electro-magnetic performance of the motor has deteriorated beyond the predetermined threshold, the controller 118 activates an alert mechanism 154 that notifies the user of a pending motor fault. The alert mechanism 154 can be any device that conveys information to the user about the fault, such as a visual or audible warning. The alert mechanism 154 may also be a device that generates a digital signal to a master system to alert the system of the pending motor fault.

As shown in FIG. 3, magnetic rotor 102 demagnetization and other conditions will cause the back EMF of the motor 100 to have a smaller magnitude. The predetermined threshold may be obtained experimentally by obtaining the measured back EMF signature 152 of the motor 100 when its performance is at an unacceptable level and then setting the threshold to be a selected percentage (e.g., ten percent) higher than the signature at failure. In this way, it is possible to catch motor performance deterioration before an actual performance failure occurs, allowing a user to pro-actively address motor maintenance issues before they cause problems. This ensures that motor performance can remain consistently reliable.

The comparison itself may be conducted by converting the raw voltage signal to an RMS voltage value and then comparing the RMS voltage value of the motor in its current operating state with the reference RMS voltage value of a healthy motor. The RMS voltage value corresponds to the amount of energy generated by the permanent magnet motor because the RMS voltage effectively represents the area under the curve shown in FIG. 3. The comparison may also be conducted by digitizing the voltage trace and storing specific voltage levels vs. time points to capture and characterize the voltage waveform. The waveform, peak value, RMS value, or any other characteristic reflecting the current operating state of the motor can them be compared with a corresponding characteristic in a healthy motor.

Figure 4:
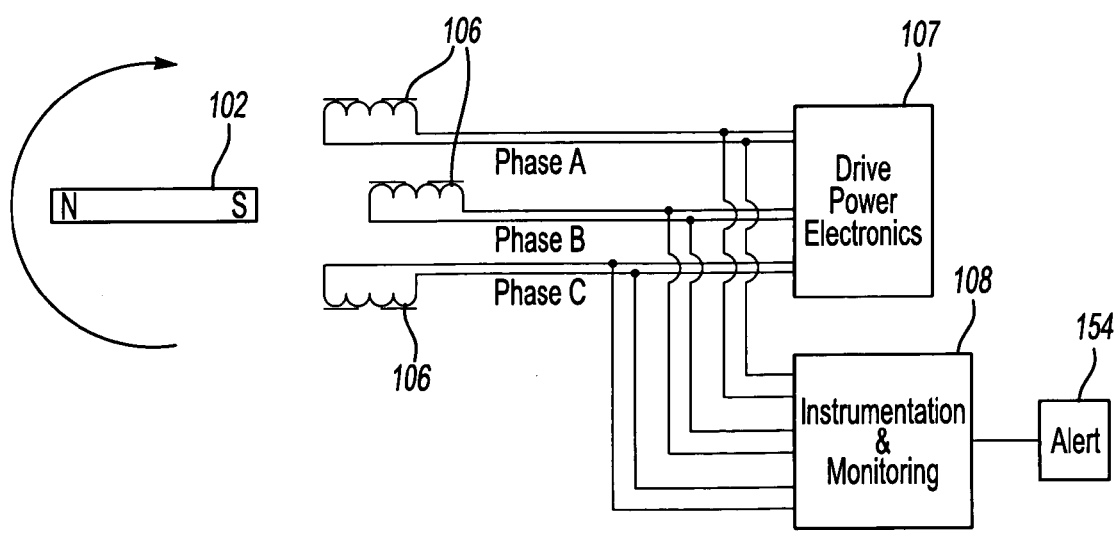
FIG. 4 is a schematic diagram of another permanent magnet motor to be monitored by another embodiment of the invention.
Figure 5:
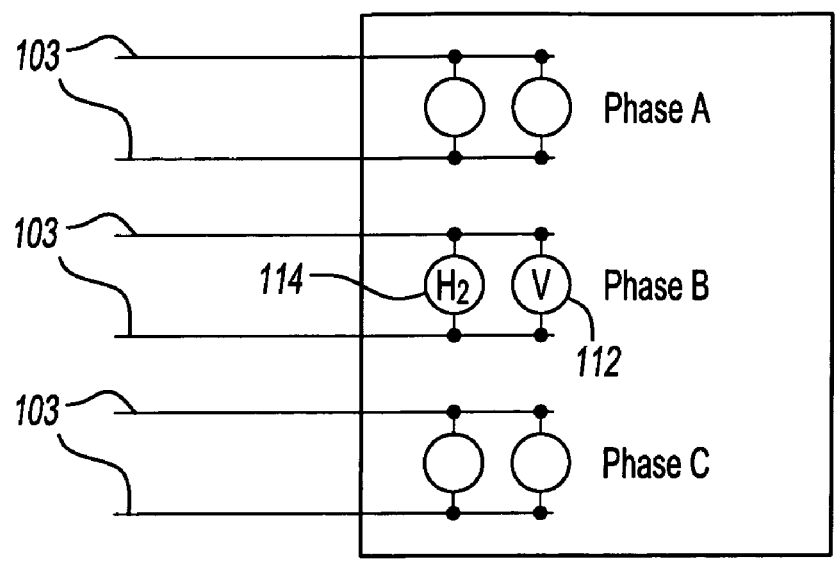
FIG. 5 is a schematic diagram of the monitoring system according to another embodiment of the invention.
Figure 6:
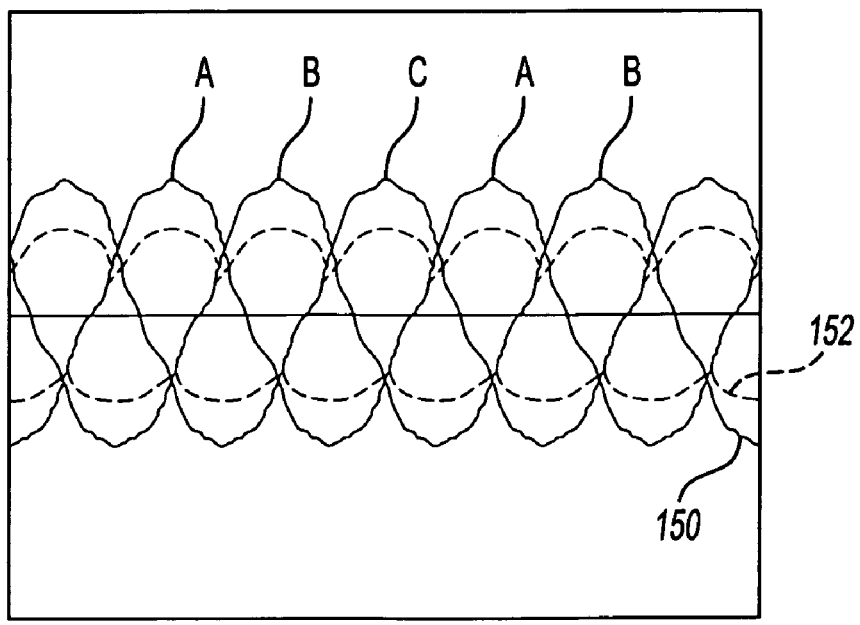
FIG. 6 is a graphic showing an example of a comparison conducted by the monitoring system of FIG. 5.

FIGS. 4, 5 and 6 illustrate another embodiment of the invention. As shown in FIG. 4, the connection between the phases is conducted in the drive power electronics 107 rather than at the windings 106. By keeping the phases separate at the windings, the phases can be tapped by the voltmeter 112 and the speed sensor 114 either as pairs or independently as individual phases. As shown in FIG. 5, it is possible to measure the voltage and frequency of each phase individually, without reference to other phases, rather than across phase pairs as in the previous embodiment. To do this, the voltmeter 112 and/or the speed sensor 114 measures across a lead 103 pair associated with one of the individual phases. FIG. 6 shows one example of the traces of all three phases in relation to each other, illustrating the difference between the back EMF signature 150 of a healthy device and the back EMF signature 152 of a device with reduced capabilities.

Note that implementation of the invention uses information that is already available to the controller 118 (i.e., voltage, speed, temperature) and therefore does not require any new sensors or other hardware dedicated to the invention. Moreover, the logic needed to carry out the inventive method can be easily programmed into the controller 118. By monitoring the inherent electromechanical and magnetic properties of the motor components and incorporating intelligence in the controller 118 to interpret these properties with respect to a reference, the overall health condition of the motor 100 can be monitored to detect when service or scheduled maintenance is needed well before the system is not operationally acceptable. This periodic monitoring makes it possible to prolong the life of the motor 100 and ensure motor reliability through early problem detection and solving. The invention also eliminates the need to implement premature proactive maintenance or replacements in an attempt to ensure high reliability. As a result, the inventive monitoring system optimizes maintenance scheduling and minimizes overall long-term operational costs.

A similar health monitoring scheme may be applied if the device is running as a generator as well. The difference between the generator and the motor is that in case of a generator, the mechanical energy is converted into an electrical energy in the form of output voltage and current. Thus, the back EMF can be made as a reference as a function of speed. The terminal voltage, which is the difference of the back EMF and the impedance drop, is a function of load current. Therefore, for the generator application, the health monitoring can be done by using a method and system similar to the method and system described above, except that in this case, the back EMF, the terminal voltage, and load current are measured at a given load to establish a signature response. A measured signature is then obtained periodically during the life of the generator at the same conditions as the reference signature to check the current terminal voltage characteristics of the generator.

It should be understood that various alternatives to the embodiments of the invention described herein may be employed in practicing the invention. It is intended that the following claims define the scope of the invention and that the method and apparatus within the scope of these claims and their equivalents be covered thereby.

What is claimed is:

1. A method of monitoring a permanent magnet device having at least three leads corresponding to three phases, comprising:
   obtaining a reference signature reflecting a response of the device during a first operating state;
   obtaining a measured signature reflecting a back EMF response of the device during a second operating state, wherein the back EMF response of the device is a back EMF response between any two of the three leads corresponding to a pair of said three phases;

comparing the measured signature with the reference signature; and indicating a potential device fault if the measured signature deviates from the reference signature by a predetermined threshold.

2. The method of claim 1, wherein the first operating state is a normal healthy condition state.

3. The method of claim 1, wherein the reference signature and the measured signature are obtained at a same device speed and temperature.

4. The method of claim 1, wherein the at least three leads includes six leads corresponding to the three phases, each phase having two corresponding leads.

5. The method of claim 1, wherein the step of obtaining the measured signature is repeated periodically.

6. A method of monitoring a permanent magnet device comprising:

obtaining a reference signature reflecting a response of the device during a first operating state;

obtaining a measured signature reflecting a back EMF response of the device during a second operating state, wherein the reference signature and the measured signature are RMS voltage values, and wherein the method further comprises converting a raw voltage trace of the device to the RMS voltage value of the measured signature;

comparing the measured signature with the reference signature and indicating a potential device fault if the measured signature deviates from the reference signature by a predetermined threshold.

7. A method of monitoring a permanent magnet device, comprising:

obtaining a reference signature reflecting a response of the device during a first operating state;

digitizing a voltage trace of the device, wherein a plurality of voltage levels versus time points corresponding to the voltage trace obtained during the digitizing step is a measured signature reflecting a response of the device during a second operating state;

comparing the measured signature with the reference signature; and indicating a potential device fault if the measured signature deviates from the reference signature by a predetermined threshold.

8. A health monitoring system for a permanent magnet electric device, comprising:

a voltage measuring device that measures a back EMF response of the device;

a memory that stores the back EMF response of the device when the device is in a normal healthy condition as a reference signature; and a controller that compares the reference signature with a measured signature reflecting the back EMF response during operation of the permanent magnet electric device, wherein the controller indicates a potential device fault if the measured signature deviates from the reference signature by a predetermined threshold, wherein a device speed is calculated from at least one of a frequency and a period of the back EMF response.

9. The system of claim 8, farther comprising an alert device that alerts via at least one of a visual, audible, and digital signaling means, wherein the controller indicates the potential device fault through the alert device.

10. The system of claim 8, further comprising a speed sensor that measures a frequency of the device to determine motor speed, the controller indicating the potential device fault based upon the motor speed.

11. The system of claim 8 wherein the reference signature and the measured signature are obtained at a same device speed and temperature.

12. The system of claim 8, further comprising an analog-to-digital converter that converts an output from the voltage measuring device into digital data.

13. A permanent magnet device for an electric engine starter, comprising:

a permanent magnet device;

a stator having a plurality of windings corresponding to a plurality of phases;

a drive power electronics unit that controls current moving through said plurality of windings;

a voltage measuring device that measures a back EMF response of the device associated with at least one phase;

a memory that stores the back EMF response of the device when the device is in a normal healthy condition as a reference signature; and a controller that compares the reference signature with a measured signature reflecting the back EMF response during operation of the permanent magnet device; and an alert device, wherein the controller indicates a potential device fault through the alert device if the measured signature deviates from the reference signature by a predetermined threshold, wherein the windings are connected together and each have an associated lead, and wherein the voltage measuring device measures the back EMF response by measuring across a pair of the leads, which are associated with a pair of the windings.

14. The device of claim 13, wherein the reference signature and the measured signature are obtained by the controller at a same device speed and temperature.

15. The device of claim 13, further comprising an analog-to-digital converter that converts an outputs from the voltage measuring device into digital data to be sent to the controller.

16. The device of claim 13, wherein the windings are coupled together in the drive power electronics unit and wherein the associated lead is one of an associated lead pair associated with each of the windings, and wherein the voltage measuring device measures the back EMF response over one of said plurality of phases by measuring between a lead pair associated with one of the windings.

* * * * *